United States Patent
Lee et al.

(10) Patent No.: US 7,085,168 B2
(45) Date of Patent: Aug. 1, 2006

(54) PROGRAMMING METHOD FOR CONTROLLING MEMORY THRESHOLD VOLTAGE DISTRIBUTION

(75) Inventors: Ming-Hsiu Lee, Hsinchu (TW); Chao-I Wu, Hsinchu (TW); Tzu-Hsuan Hsu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/026,799

(22) Filed: Dec. 30, 2004

(65) Prior Publication Data

US 2006/0146613 A1    Jul. 6, 2006

(51) Int. Cl.
*G11C 16/34* (2006.01)

(52) U.S. Cl. .......................... 365/185.24; 365/185.22; 365/185.03; 365/185.02

(58) Field of Classification Search ........... 365/185.03, 365/185.02, 185.22, 185.24
See application file for complete search history.

(56) References Cited

U.S. PATENT DOCUMENTS

| 6,937,511 B1 * | 8/2005 | Hsu et al. ............. 365/185.03 |
| 2005/0162922 A1 * | 7/2005 | Hsu et al. ............. 365/185.28 |

* cited by examiner

*Primary Examiner*—Andrew Q. Tran
(74) *Attorney, Agent, or Firm*—Martine Penilla & Gencarella LLP (57) ABSTRACT

A method for programming one or more memory cells is disclosed. The one or more memory cells need to be two sides operated. After verifying both sides of each memory cell to identify the sides of the memory cells to be programmed, a programming voltage pulse is given to the first sides of the memory cells identified to be programmed. Another verification process is performed for both sides of each memory cell to identify the sides of the memory cells to be programmed. Next, a programming voltage pulse is given to the second sides of the memory cells identified to be programmed. The verifying both sides, programming the first sides, verifying both sides, and programming the second sides will continue until the both sides of each memory cell are programmed to a target programming voltage. The target programming voltage might have multiple voltage levels.

31 Claims, 6 Drawing Sheets

PROGRAMMING METHOD FOR CONTROLLING MEMORY THRESHOLD VOLTAGE DISTRIBUTION

BACKGROUND OF THE INVENTION

1. Field of the Invention

The present invention relates generally to methods for programming semiconductor memory cells, and more particularly, to a programming method for controlling memory threshold voltage distributions for one or more double-sided semiconductor memory cells.

2. Description of the Related Art

A semiconductor memory cell, or a memory cell, such as a nitride read only memory (NROM) cell, is typically programmed by applying a programming pulse thereto, thus causing charges to become trapped in a retention layer of the memory cell. The trapped charges in the retention layer of a memory cell induce the increase of the threshold voltage for the memory cell.

In order to verify whether the increased threshold voltage of the programmed memory cell has reached its target programming voltage, a verifying pulse, following the programming pulse, is applied to the programmed memory cell. If the verifying pulse reveals that the programmed memory cell has not yet reached the target programming voltage, an additional programming pulse is applied, followed by a subsequent verifying pulse. Typically, during the programming process, the programming pulse increases in voltage levels, commencing at a relatively low voltage level and terminating at a higher voltage level. The programming and the verifying will continue until the target programming voltage has been reached.

For a multiple-leveled double-sided memory cell, different target programming voltages might exist for each side of the memory cell. The programming method for a double-sided memory cell typically involves programming and verifying one side of the memory cell until its threshold voltage reaches the target programming voltage for this side, then programming and verifying the other side of the memory cell until its threshold voltage reaches its target programming voltage.

Figure 1:
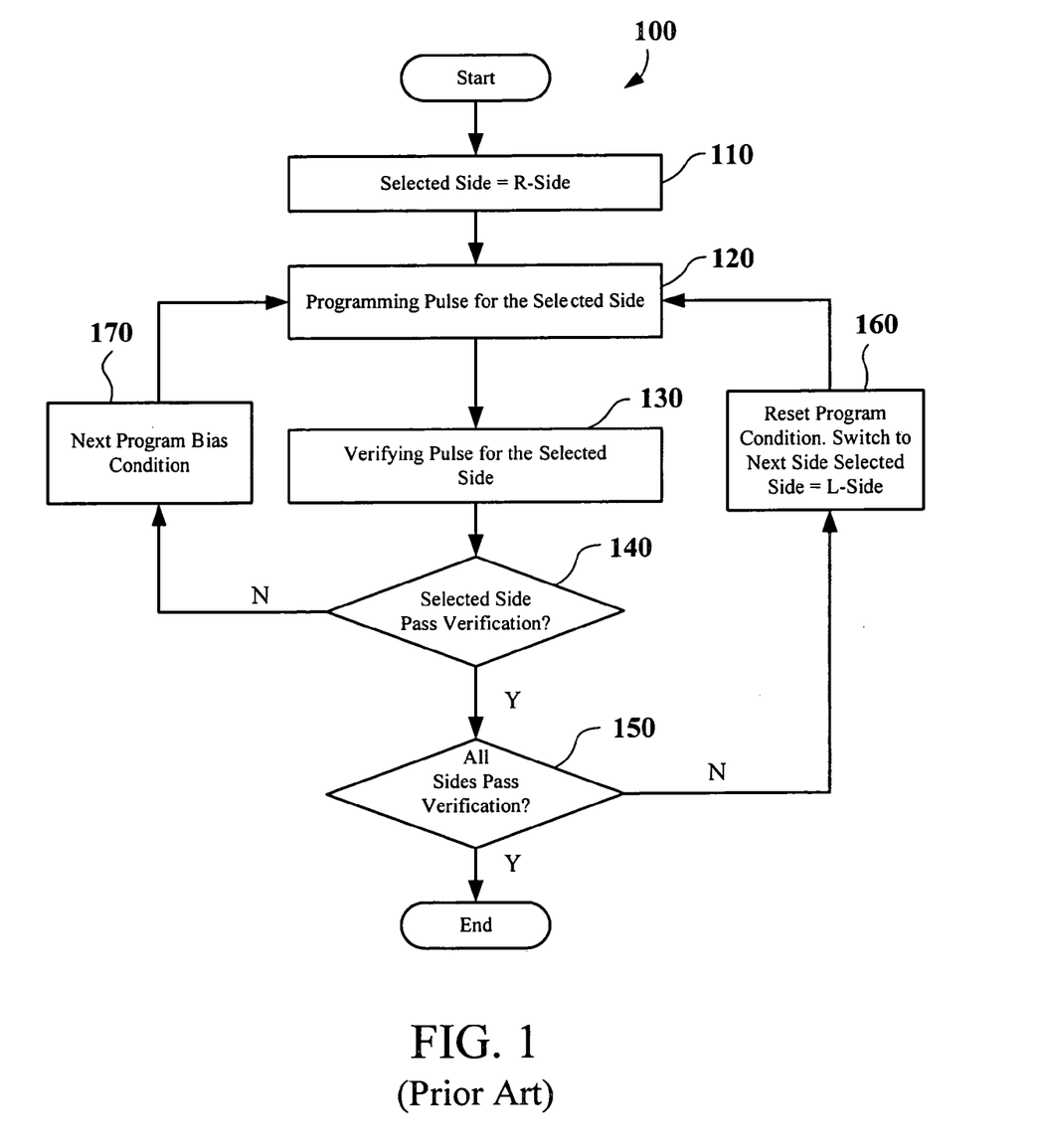
FIG. 1 is a flow chart illustrating a conventional programming method for a multiple-leveled double-sided memory cell.

FIG. 1 is a flow chart 100 illustrating a conventional programming method for a multiple-leveled double-sided memory cell. The programming operation commences with selecting the right side to be programmed (step 110). In step 120, the selected side is applied with a programming pulse. A verifying pulse for the selected side is followed in step 130. The verification result is queried in step 140, determining whether the threshold voltage of the selected side reaches its target programming voltage. If the target programming voltage for the selected side is not reached, the selected side does not pass the verification. The programming pulse will be adjusted, usually to a higher voltage level, in step 170, the programming (step 120) and the verifying (step 130) will be performed again for the selected side. If the selected side passes the verification, i.e., its threshold voltage reaches its target programming voltage, both sides of the memory cell will be checked to see whether they have reached their target programming voltages in step 150. If the other side needs to be programmed, the left side is selected and the program condition is reset in step 160. The programming and the verifying processes will start for the newly selected side (left side).

The conventional programming method for multiple-leveled double-sided memory cells mainly has the following drawbacks. First of all, due to the second bit effect, the threshold voltages of one side of the memory cell will be affected by the charge stored at the other side of the memory cell. Secondly, the array effect will affect the threshold voltage distributions for a memory cell in a memory array, i.e., the threshold voltage of a selected memory cell will be affected by the leakage current to neighboring memory cells that share the same word line with the selected memory cell, thus resulting in difficulties to achieve narrow threshold voltage distributions. Wide threshold voltage distributions for a memory array will reduce the read margin window for memory array between a programming state and an erased state.

Figure 2:
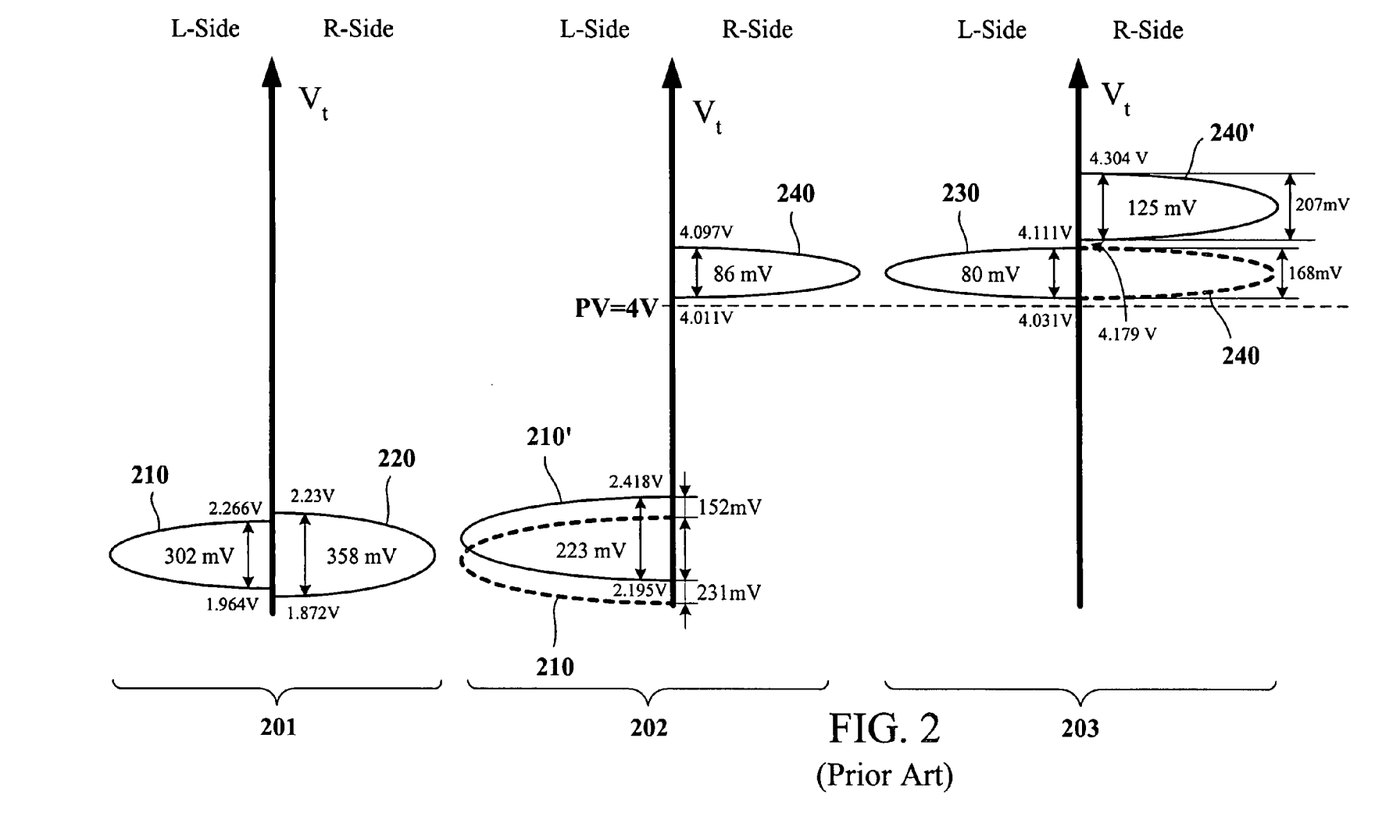
FIG. 2 shows diagrams illustrating the threshold voltage Vt distributions for a 9-cell nitride read only memory (NROM) array that are programmed by a conventional programming method.

FIG. 2 shows three diagrams illustrating the threshold voltage Vt distributions of a 9-cell NROM array that are programmed by a conventional programming method. Each NROM cell of the NROM array is capable of double-sided operations. The target programming voltage PV for both sides of the NROM cells in the NROM array is 4V. The programming for the NROM array includes three steps: 201, 202, and 203.

In step 201, no charges are stored at both the right sides and the left sides of the NROM cells in the NROM array. The threshold voltage distributions 210 and 220 are the threshold voltage distributions for the left sides and the right sides of the NROM cells in the NROM array when no charges are stored at both sides.

In step 202, the right sides of the NROM cells in the NROM array are programmed to achieve the target programming voltage 4V. The threshold voltage distribution 240 is the threshold voltage distribution for the right sides of the NROM array after the right sides of the NROM array are programmed. As shown, although the left sides of the NROM array are not programmed in step 202, the second bit effect causes the threshold voltage distribution 210 for the left sides of the NROM array to shift to a higher threshold voltage region, forming the threshold voltage distribution 210'. The low bond threshold voltage shift between the threshold voltage distributions 210 and 210' is 231 mV, while the high bond threshold voltage shift between the threshold voltage distributions 210 and 210' is 152 mV.

In step 203, the left sides of the NROM cells in the NROM array are programmed until the target programming voltage 4V is reached. The threshold voltage distribution 230 is the threshold voltage distribution of the left sides of the NROM array after the left sides of the NROM array are programmed. As shown, due to the second bit effect, the threshold voltage distribution 240 for the right sides of the NROM array has shifted to a higher threshold voltage region, forming the threshold voltage distribution 240'. The low bond threshold voltage shift between the threshold voltage distributions 240 and 240' is 168 mV, while the high bond threshold voltage shift between the threshold voltage distributions 240 and 240' is 207 mV. In addition, the width of threshold voltage distribution 240 is increased from 86 mV to 125 mV in the threshold voltage distribution 240'. The deviations and the increased widths of the threshold voltage distributions make the threshold voltage distributions of the NROM cells difficult to control.

In view of the foregoing, there is a need for a programming method for one or more double-sided memory cells that can reduce the impacts of the second bit effect and the array effect to the threshold voltage distributions of the memory cells.

SUMMARY OF THE INVENTION

Broadly speaking, the present invention fills this need by providing a programming method for one or more memory cells that are two sides operated. The one or more memory cells could be single-leveled or multiple-leveled memory cells; and the one or more memory cells could be non-volatile memory cells or volatile memory cells.

In accordance with one aspect of the present invention, a method for programming one or more memory cells is provided. The method includes verifying both sides of each memory cell to identify the sides of the memory cells to be programmed, and programming the first sides of the memory cells identified to be programmed. After programming for the first sides of the memory cells, another verification process is performed for both sides of each memory cell to identify the sides of the memory cells to be programmed. Then, a programming process is performed for the second sides of memory cells identified to be programmed. The verifying both sides, programming the first sides, verifying both sides, and programming the second sides will continue until both sides of each memory cell are programmed to a target programming voltage.

In accordance with another aspect of the present invention, a method for programming one or more memory cells is described. The programming method commences with reading a voltage on a side of a memory cell and identifying the side to be programmed if the voltage read from the side does not reach a target programming voltage. The reading and the identifying processes will continue until both sides of each memory cell are read and identified. A programming pulse will be given to the first sides of the memory cells identified. After the programming for the first sides of the memory cells, the reading and the identifying processes will be repeated until both sides of each memory cell are read and identified. Next, a programming pulse will be given to the second sides of the memory cells identified. The reading and identifying for both sides, programming for the first sides, reading and identifying for both sides, and programming for the second sides will continue until both sides of each memory cell are programmed to the target programming voltage.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 3:
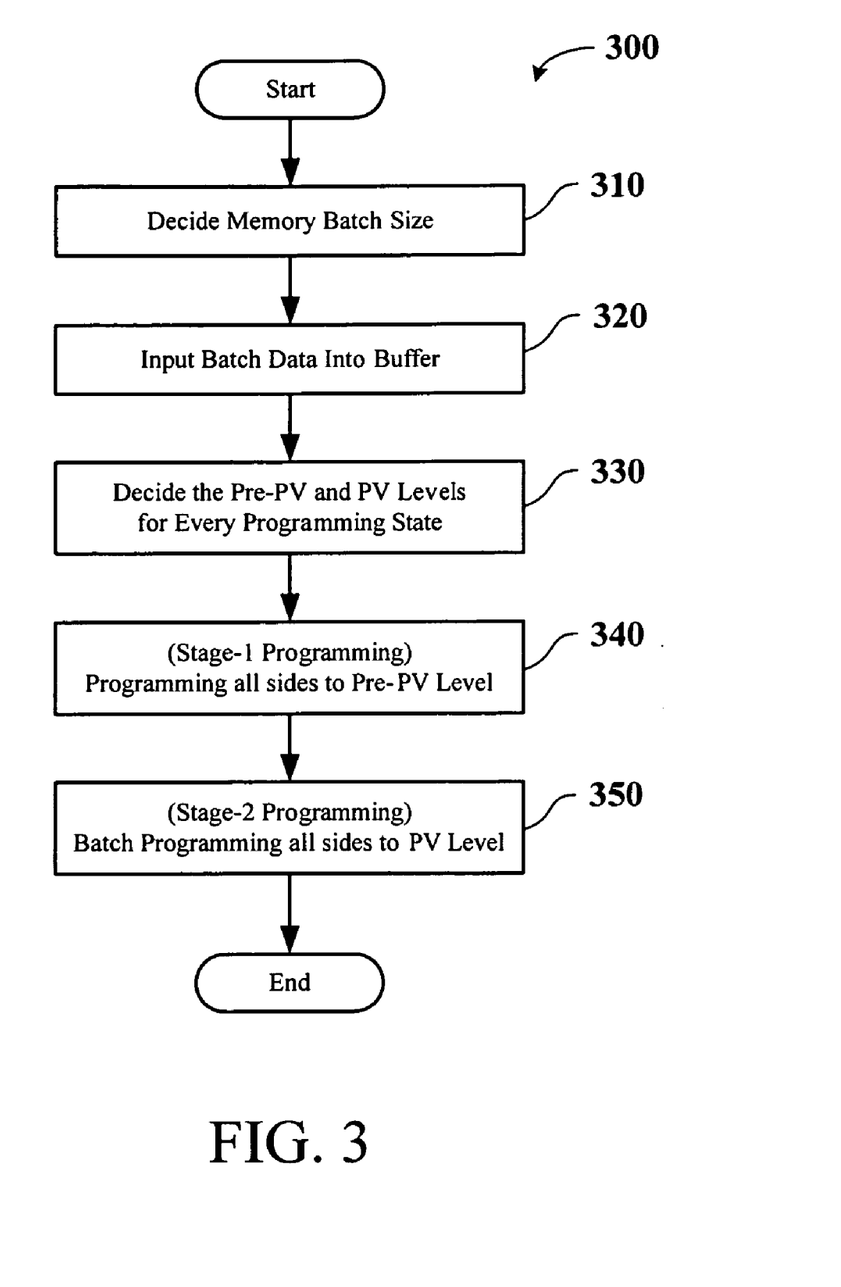
FIG. 3 is a flow chart illustrating an exemplary programming method for a memory batch in accordance with one embodiment of the present invention.

FIG. 3 is a flow chart 300 illustrating an exemplary programming method for a memory batch in accordance with one embodiment of the present invention. The memory cells in this memory batch are capable of storing charges at both sides. The memory cells could be non-volatile memory cells or volatile memory cells. The memory cells could be single-leveled or multi-leveled memory cells. The memory cells could be nitride read only memory (NROM) cells, programming by hot-hole injection nitride electron storage (PHINES) cells, or localized nanocrystal silicon cells.

In step 310, the memory batch size to be programmed is determined. The size of the memory batch could be a single memory cell, a portion or all of the memory cells that share a word line, or a single page of memory cells.

In step 320, the pre-determined batch data, which indicate the programming states of the memory cells in the memory batch, are loaded into a buffer.

In step 330, a pre-programming voltage Pre-PV and a target programming voltage PV are decided for each side of the memory cells to be programmed according to the batch data in the buffer. The pre-programming voltage Pre-PV is slightly smaller or larger than the target programming voltage PV depending upon the type of memory cells to be programmed. The pre-programming voltage Pre-PV and the target programming voltage PV could have multiple levels.

In step 340, both sides of each memory cells in the memory batch are programmed to the pre-programming voltage Pre-PV in a pre-programming (stage-1 programming) process. The programming method of the pre-programming process could be a conventional programming method demonstrated in flow chart 100 of FIG. 1, a batch programming method, or any other programming method. The purpose of the stage-1 programming in this step is to quickly program the memory cells in the memory batch to a programming voltage that is close to the target programming voltage PV.

In step 350, both sides of each memory cell in the memory batch are programmed to the target programming voltage PV in a batch programming (stage-2 programming) process. For the batch programming process, a batch programming method, which will be described in detail below, is used. The batch programming in this step is for fine-tuning the threshold voltage distributions for this memory batch.

Figure 4:
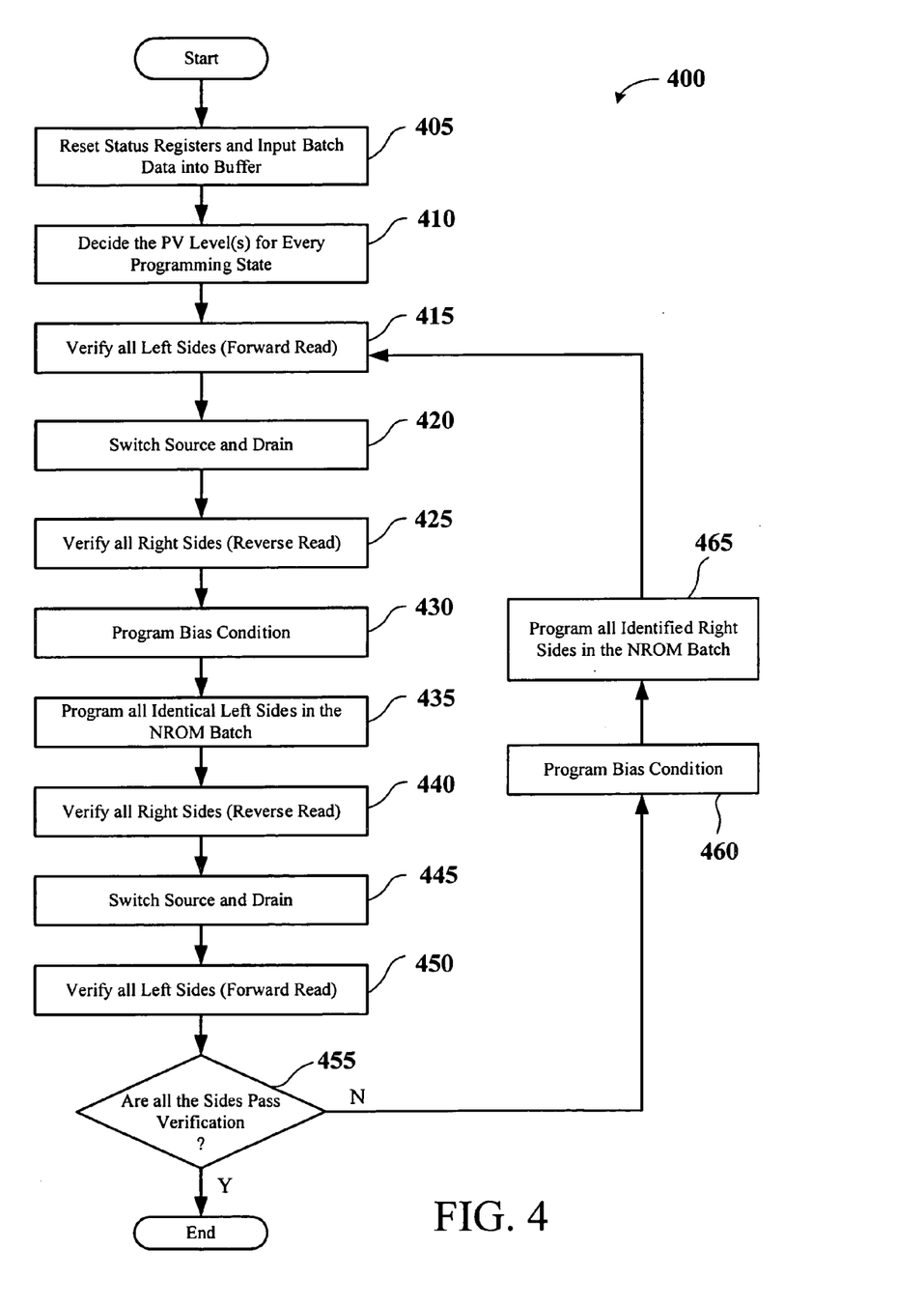
FIG. 4 is a flow chart illustrating an exemplary batch programming method for a NROM batch in accordance with one embodiment of the present invention.

FIG. 4 is a flow chart 400 illustrating an exemplary batch programming method for a NROM batch in accordance with one embodiment of the present invention. In this embodiment, only the batch programming method is used. The size of the NROM batch could be a single NROM cell, a portion or all of the NROM cells that share a word line, or a single page of NROM cells. The target programming voltage is PV.

In step 405, status registers are reset and the pre-determined batch data are input into the buffer. One status register is needed for each side of a NROM cell. If a side of a NROM cell does not reach its target programming voltage after a programming operation, its corresponding status register will be set. The batch data indicate the programming states of the NROM cells of the NROM batch in the forms of the logic states.

In step 410, a target programming voltage PV is decided for each side of each memory cell according to the batch data in the buffer. The target programming voltage PV could have multiple levels.

From step 415 to step 425, all of the sides of the NROM batch are verified to see whether their threshold voltages reach the target programming voltage PV. In step 415, all of the left sides of the NROM batch are read to verify the threshold voltages of the left sides. For those of the left sides whose threshold voltages do not reach the target programming voltage PV, their corresponding status registers will be set and those left sides are identified to be programmed. After all of the left sides of the NROM batch are read and identified, the source and drain terminals of the NROM cells of the NROM batch are switched in step 420 in order to save time for reading the right sides of the NROM batch. In step 425, all of the right sides of the NROM batch are read. For those of the right sides whose threshold voltages do not reach the target programming voltage PV, their corresponding status registers will be set and those right sides are identified.

In step 430, the programming bias condition is determined for programming the left sides of the NROM batch. The programming bias condition varies based on the memory type and the memory batch size. In one embodiment, the gate programming voltage Vg is about 9V, while the drain programming voltage ranges between about 6V to about 8.5V with a stepping voltage of 0.1V. The source terminal is grounded. The width of each of the gate programming voltage pulse and the drain programming voltage pulse is about 0.5 us.

In step 435, all of the identified left sides of the NROM batch are programmed under the programming bias condition set in step 430.

From step 440 to step 450, all of the sides of the NROM batch are verified to see whether their threshold voltages reach the target programming voltage PV. In step 440, all of the right sides of the NROM batch are read to verify the threshold voltages of the right sides. For those of the right sides whose threshold voltages do not reach the target programming voltage PV, their corresponding status registers will be set and those right sides are identified. After all the right sides of NROM batch are read and verified, the source and drain terminals of the NROM cells in the NROM batch are switched in step 445 in order to save time for reading the left sides of the NROM batch. In step 450, all of the left sides of the NROM batch are read to verify the threshold voltages of the left sides. For those left sides whose threshold voltages do not reach the target programming voltage PV, their corresponding status registers will be set and those left sides are identified.

In step 455, the status registers for the NROM batch are checked to see whether all of the sides of the NROM batch pass the verification. If one or more sides remain unprogrammed, i.e., the threshold voltages of those sides do not reach the target programming voltage, the programming process will proceed to step 460.

In step 460, the programming bias condition is determined for programming the right sides of the NROM batch. The programming bias condition varies based on the memory type and the memory batch size. In one embodiment, the gate programming voltage Vg is about 9V, while the drain programming voltage ranges between about 6V to about 8.5V with a stepping voltage of 0.1V. The source terminal is grounded. The width of each of the gate programming voltage pulse and the drain programming voltage pulse is about 0.5 us.

In step 465, all of the identified right sides of the NROM batch are programmed under the programming bias condition determined in step 460. The batch programming process will continue until all sides of the NROM batch are programmed, i.e., until the threshold voltages of all of the sides in the NROM batch reach the target programming voltage PV.

Figure 5:
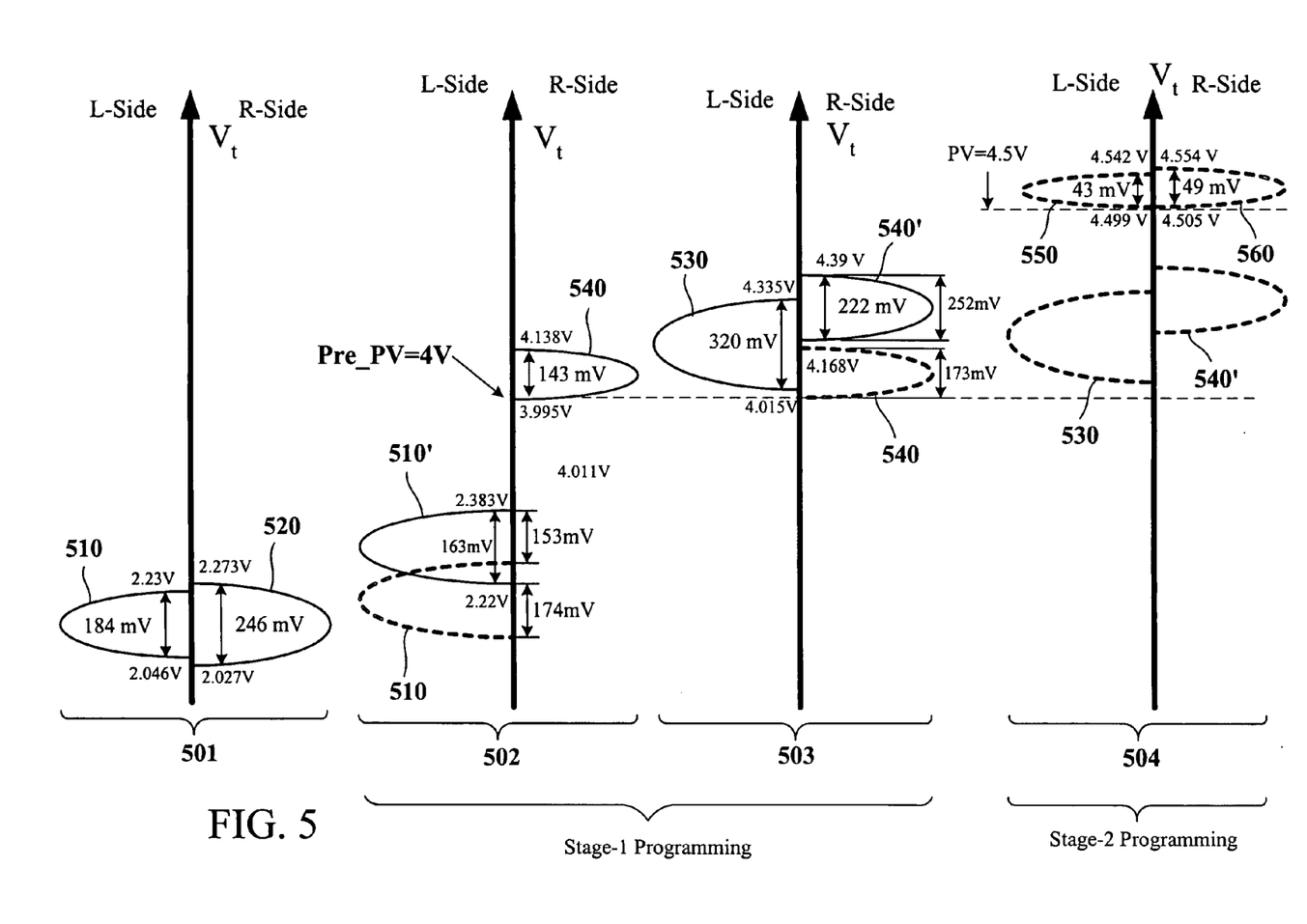
FIG. 5 shows diagrams illustrating the threshold voltage Vt distributions for a 9-cell NROM array in accordance with one embodiment of the present invention.

FIG. 5 shows diagrams illustrating the threshold voltage Vt distributions of a 9-cell NROM array in accordance with one embodiment of the present invention. In this embodiment, the NROM array is programmed by the programming method demonstrated in flow chart 300 of FIG. 3.

The programming process is divided into to two stages. The stage-1 programming is for quickly raising the threshold voltages of the NROM array to a pre-programming voltage Pre-PV, which is close to the final target programming voltage PV. The stage-2 programming is for fine-tuning the threshold voltage distributions of the NROM array such that the threshold voltage distributions of the NROM array can be controlled, i.e., the deviations and the widths of the threshold voltage distributions of the NROM array are decreased.

For this embodiment, the pre-programming voltage Pre-PV is 4V in the stage-1 programming and the target programming voltage PV is 4.5V in the stage-2 programming. The stage-1 programming is implemented by the conventional programming method shown in the flow chart 100 of FIG. 1, whereas the stage-2 programming is implemented by the batch programming method demonstrated in the flow chart 400 of FIG. 4.

In step 501, none of the NROM cells in the NROM array is programmed. As a result, the threshold voltages of the left sides and right sides of the NROM array are low. The threshold voltage distribution 510 is the threshold voltage distribution of the left sides of the NROM array when no left sides of the NROM array are programmed. The threshold voltage distribution 520 is the threshold voltage distribution of the right sides of the NROM array when no right sides of the NROM array are programmed.

The stage-1 programming includes two steps: step 502 and step 503. In step 502, the right sides of the NROM array are programmed to the Pre-PV (4V), thus resulting in the threshold voltage distribution 540. The threshold voltage distribution 510 of the left sides of the NROM array is affected by the second bit effect; therefore, the threshold voltages of the left sides of the NROM array are increased, resulting in the new threshold voltage distribution 510'. The high bond threshold voltage shift between the threshold voltage distributions 510' and 510 is 153 mV, while the low bond threshold voltage shift between the threshold voltage distributions 510' and 510 is 174 mV.

In step 503, the left sides of the NROM array are programmed to the Pre-PV (4V), forming the threshold voltage distribution 530. Due to the second bit effect, the threshold voltages of the right sides of the NROM array are affected, resulting in the threshold voltage distribution 540'. The high bond threshold voltage shift between the threshold voltage distributions 540' and 540 is 252 mV, while the low bond threshold voltage shift between the threshold voltage distributions 540' and 540 is 173 mV.

The stage-2 programming is implemented in step 504 by the batch programming method demonstrated in the flow chart 400 of FIG. 4. As shown, the final threshold voltage distributions of the NROM array are very close to the target threshold voltage PV (4.5V). Furthermore, the widths of the threshold voltage distributions 550 and 560 are much smaller than the ones of the threshold voltage distributions 530 and 540. The threshold voltage distribution 550 is the threshold voltage distribution of the left sides of the NROM array, while the threshold voltage distribution 560 is the threshold voltage distribution of the right sides of the NROM array.

Figure 6:
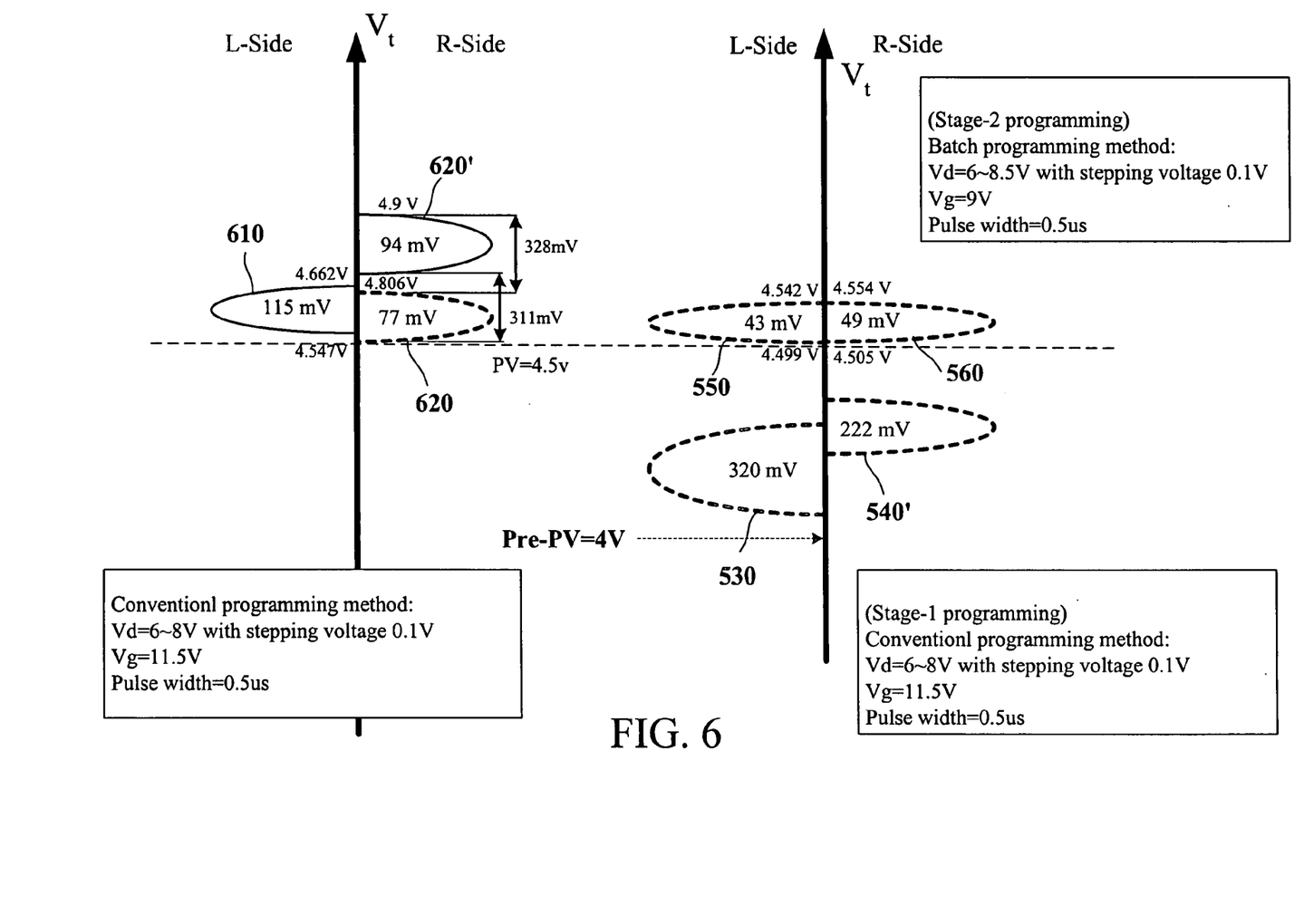
FIG. 6 shows diagrams comparing the threshold voltage Vt distributions obtained by a conventional programming method with the threshold voltage Vt distributions obtained by the invented programming method for a 9-cell NROM array in accordance with one embodiment of the present invention.

FIG. 6 shows two diagrams comparing the threshold voltage distributions obtained by using the conventional programming method with the ones obtained by using the invented programming method for a 9-cell NROM array in accordance with one embodiment of the present invention. The left diagram shows the threshold voltage distributions obtained by using the conventional programming method for the 9-cell NROM array, while the right diagram is the final threshold voltage distributions shown in step 504 of FIG. 5. The conventional programming method only has one programming stage. The programming conditions for the conventional programming method and the invented programming method are shown in FIG. 6. The target programming voltage PV is 4.5V.

The threshold voltage distribution 610 is the left-side threshold voltage distribution for the NROM array, and the threshold voltage distribution 620' is the right-side threshold voltage distribution of the NROM array. The threshold voltage distribution 620 is the original right-side threshold voltage distribution when the left sides of the NROM array are not programmed. The total distribution width for the 9-cell NROM array by the conventional programming method is 353 mv, which is the difference between the high bond of the threshold voltage distribution 620' and the low bond of the threshold voltage distribution 610.

The threshold voltage distribution 550 and the threshold voltage distribution 560 are respectively the left-side and the right-side threshold voltage distributions of the NROM array. The total distribution width for the 9-cell NROM array by the invented programming method is 55 mv, which is the difference between the high bond of the threshold voltage distribution 560 and the low bond of the threshold voltage distribution 550.

As illustrated, the threshold voltage distributions of the NROM array obtained by the invented programming method have much less deviation and the total distribution width of the threshold voltage distributions of the NROM array is much smaller, as compared with the ones obtained by the conventional programming method. Because the invented programming method takes the second bit effect and the array effect into consideration during the double-sided verification process, more accurate and narrow threshold voltage distributions can be achieved for double-sided memory cells. In general, the total distribution width for a memory batch can be controlled to be less than 200 mV by the invented programming method.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A method for programming one or more memory cells, comprising:
    (a) providing the one or more memory cells, wherein each memory cell has a first side and a second side, and each of the first side and the second side of each memory cell has a threshold voltage;
    (b) verifying both the first side and the second side of the one or more memory cells to identify sides of memory cells to be programmed; and
    (c) programming only the first side of each memory cell identified to be programmed.

2. The method for programming one or more memory cells as recited in claim 1, further comprising:
    (d) repeating the verifying of (b); and
    (e) repeating the programming of (c) for only the second side of each memory cell identified to be programmed.

3. The method for programming one or more memory cells as recited in claim 2, further comprising,
    repeating (b), (c), (d), and (e) until each of the first side and the second side of the one or more memory cells is programmed to a target programming voltage.

4. The method for programming one or more memory cells as recited in claim 3, wherein the target programming voltage has multiple levels.

5. The method for programming one or more memory cells as recited in claim 3, wherein the threshold voltage is below or above the target programming voltage.

6. The method for programming one or more memory cells as recited in claim 1, wherein the verifying includes reading a voltage on each of the first side and the second side of each memory cell, and identifying those of the first side and the second side of each memory cell to be programmed if the voltage read does not reach a target programming voltage.

7. The method for programming one or more memory cells as recited in claim 1, wherein the programming of (c) is performed by applying a programming voltage pulse to the memory cells identified to be programmed.

8. The method for programming one or more memory cells as recited in claim 1, wherein the one or more memory cells are single-leveled or multiple-leveled memory cells.

9. The method for programming one or more memory cells as recited in claim 1, wherein the one or more memory cells are non-volatile memory cells.

10. The method for programming one or more memory cells as recited in claim 9, wherein the one or more memory cells are programming by hot-hole injection nitride electron storage (PHINES) cells.

11. The method for programming one or more memory cells as recited in claim 9, wherein the one or more memory cells are localized nanocrystal silicon cells.

12. The method for programming one or more memory cells as recited in claim 9, wherein the one or more memory cells are nitride read only memory (NROM) cells.

13. The method for programming one or more memory cells as recited in claim 1, wherein the one or more memory cells are volatile memory cells.

14. The method for programming one or more memory cells as recited in claim 1, wherein the threshold voltage is a voltage when none of the first side and the second side of each memory cell is programmed.

15. The method for programming one or more memory cells as recited in claim 1, wherein the threshold voltage is a voltage to which the first side and the second side of each memory cell are programmed.

16. The method for programming one or more memory cells as recited in claim 1, wherein the threshold voltage has multiple levels.

17. A method for programming one or more memory cells, comprising:
 (a) providing the one or more memory cells, wherein each memory cell has a first side and a second side, and each of the first side and the second side of each memory cell has a threshold voltage;
 (b) reading a voltage on the first side and the second side of a memory cell;
 (c) identifying the side of the memory cell to be programmed if the voltage read from the side of the memory cell does not reach a target programming voltage;
 (d) repeating (b) and (c) until each of the first side and the second side of each memory cell of the one or more memory cells is read and identified;
 (e) programming only the first side of each memory cell identified to be programmed;
 (f) repeating the reading of (b) and the identifying of (c) until each of the first side and the second side of each memory cell of the one or more memory cells is read and identified;
 (g) programming only the second side of each memory cell identified to be programmed; and
 (h) repeating (b), (c), (d), (e), (f), and (g) until each of the first side and the second side of the one or more memory cells is programmed to the target programming voltage.

18. The method for programming one or more memory cells as recited in claim 17, wherein the programming of (e) and (g) are performed by applying a programming voltage pulse to the one or more memory cells identified to be programmed.

19. The method for programming one or more memory cells as recited in claim 17, wherein the identifying of (c) is performed by setting a register associated with the side of the first side and the second side whose threshold voltage does not reach the target programming voltage, each of the first side and the second side of each memory cell has a corresponding register.

20. The method for programming one or more memory cells as recited in claim 17, wherein the one or more memory cells are non-volatile memory cells.

21. The method for programming one or more memory cells as recited in claim 20, wherein the one or more memory cells are programming by hot-hole injection nitride electron storage (PHINES) cells.

22. The method for programming one or more memory cells as recited in claim 20, wherein the one or more memory cells are localized nanocrystal silicon cells.

23. The method for programming one or more memory cells as recited in claim 20, wherein the one or more memory cells are nitride read only memory (NROM) cells.

24. The method for programming one or more memory cells as recited in claim 17, wherein the one or more memory cells are volatile memory cells.

25. The method for programming one or more memory cells as recited in claim 17, wherein the target programming voltage has multiple levels.

26. The method for programming one or more memory cells as recited in claim 17, wherein the threshold voltage is below or above the target programming voltage.

27. The method for programming one or more memory cells as recited in claim 17, wherein the threshold voltage is a voltage when none of the first side and the second side of each memory cell is programmed.

28. The method for programming one or more memory cells as recited in claim 17, wherein the threshold voltage is a voltage to which the first side and the second side of each memory cell are programmed.

29. The method for programming one or more memory cells as recited in claim 17, wherein the threshold voltage has multiple levels.

30. The method for programming one or more memory cells as recited in claim 17, wherein the one or more memory cells share a word line.

31. The method for programming one or more memory cells as recited in claim 17, wherein the one or more memory cells are single-leveled or multiple-leveled memory cells.

* * * * *